United States Patent

Glinski et al.

[15] 3,653,988

[45] Apr. 4, 1972

[54] METHOD OF FORMING MONOLITHIC SEMICONDUCTOR INTEGRATED CIRCUIT DEVICES

[72] Inventors: Vincent J. Glinski, Murray Hill; Bernard T. Murphy, New Providence, both of N.J.

[73] Assignee: Bell Telephone Laboratories, Incorporated, Murray Hill, Berkeley Heights, N.J.

[22] Filed: Apr. 3, 1969

[21] Appl. No.: 820,697

Related U.S. Application Data

[63] Continuation-in-part of Ser. No. 703,165, Feb. 5, 1968, abandoned.

[52] U.S. Cl. ................................148/175, 29/577, 117/201, 148/186, 148/187, 317/235 R

[51] Int. Cl. .......................H01l 7/44, H01l 3/00, B01j 17/00

[58] Field of Search...................148/1.5, 174, 175, 186, 187; 317/234, 235; 117/106, 201; 29/577

[56] References Cited

UNITED STATES PATENTS

| | | | |
|---|---|---|---|
| 2,802,760 | 8/1957 | Derick et al. | 148/1.5 |
| 3,035,186 | 5/1962 | Doucetee | 317/235 UX |
| 3,089,794 | 5/1963 | Marinace | 148/1.5 |
| 3,183,129 | 5/1965 | Tripp | 148/186 |
| 3,237,062 | 2/1966 | Murphy | 317/234 |
| 3,341,755 | 9/1967 | Husher et al. | 317/235 |
| 3,370,995 | 2/1968 | Lowery et al. | 148/175 |
| 3,378,915 | 4/1968 | Zenner | 29/577 |
| 3,388,009 | 6/1968 | King | 148/187 X |
| 3,430,110 | 2/1969 | Goshgarian | 317/234 |

*Primary Examiner*—L. Dewayne Rutledge
*Assistant Examiner*—W. G. Saba
*Attorney*—R. J. Guenther and Arthur J. Torsiglieri

[57] ABSTRACT

This method of fabricating junction-isolated semiconductor integrated circuit devices eliminates the photolithographic masking operation associated with a base diffusion by performing a non-selective P-type base diffusion into the entire surface of a thin N-type epitaxial layer. The lateral extent of base zones and resistor zones is defined by selectively diffusing low resistivity N-type deep contact zones completely through the epitaxial layer to intersect the entire perimeter of a buried N-layer. Junction isolation, consisting of either back-to-back diodes or junction field-effect transistors, may be used.

7 Claims, 11 Drawing Figures

Patented April 4, 1972

3,653,988

2 Sheets-Sheet 1

INVENTORS V.J. GLINSKI
B.T. MURPHY
BY [signature]
ATTORNEY

Patented April 4, 1972 3,653,988

2 Sheets-Sheet 2

METHOD OF FORMING MONOLITHIC SEMICONDUCTOR INTEGRATED CIRCUIT DEVICES

CROSS REFERENCES TO RELATED APPLICATIONS

This application is a continuation-in-part of the copending U.S. application Ser. No. 703,165, filed Feb. 5, 1968, now abandoned.

BACKGROUND OF THE INVENTION

1. Field of the Invention

This invention relates to semiconductor devices and, more particularly, to structures suitable for junction-isolated, planar, semiconductor integrated circuit devices.

In the art of semiconductor integrated circuitry the functions of a plurality of active and/or passive electronic elements such as transistors, diodes, resistors, and capacitors are provided upon or within a unitary body of semiconductor material. Fundamental to this art is a necessity to provide some form of electrical isolation between certain of the functional electronic elements.

Among a variety of electrical isolating arrangements, the most widely accepted technique uses a pair of back-to-back junction diodes between the functional elements. These pairs of diodes are disposed so that at least one of the junctions is reverse biased at any given time, thus providing a high impedance path between the functional elements.

2. Description of the Prior Art

Junction-isolated semiconductor integrated circuits of the prior art are exemplified in U.S. Pat. No. 3,260,902 to E. H. Porter, and in U.S. Pat. No. 3,341,755 to J. D. Husher et al.

In general, such structures comprise a P-type substrate having N-type buried zones diffused into the surface thereof. An N-type epitaxial layer is formed on the entire surface of the substrate, and diffused P-type isolation zones are formed entirely through the epitaxial layer to intersect the P-type substrate. These P-type isolation zones, in conjunction with the substrate, create islands of N-type material completely surrounded by regions of P-type material. The N-type islands are thus, to some degree, electrically isolated from each other in that an electrical charge of either polarity must pass through at least one reverse biased PN-junction in order to travel from one N-type island to another.

For applications in which it is desired to provide, within a particular N-type island, a transistor having minimum collector series resistance, the next step is the formation, within that N-type island, of highly doped, narrow N-type zones which extend completely through the epitaxial layer, i.e., from the surface thereof to the N-type buried zone beneath. These highly doped N-type zones, termed "deep contact zones" herein, reduce the resistance encountered by charge carriers traveling between N-type buried zones and electrical contacts on the surface of the epitaxial layer.

To complete an integrated circuit device, the additional functional zones (base zones, emitter zones, resistor zones, etc.) are formed selectively by standard photolithographic, oxide masking, and solid-state diffusion techniques. Electrical contacts and interconnections are formed as required.

The trend in semiconductor integrated circuit devices is to an increasing density of functional elements. In order for this trend to retain economic feasibility, improvements in fabrication techniques are desirable to avoid lower product yields. Such improvements may result from a reduction in the number of process steps as well as from a reduction of the average cross-sectional area per element and, thus, per device.

SUMMARY OF THE INVENTION

In accordance with this invention, a junction-isolated integrated circuit device structure is disclosed in which the area required per functional element is significantly reduced and in the fabrication of which a number of significant steps are eliminated, or simplified.

In a particular embodiment of this invention, fabrication of a junction-isolated semiconductor integrated circuit device begins with a substrate of a first conductivity type having a first major surface into which a first pattern of localized zones of a second conductivity type have been formed. A thin epitaxial layer of second conductivity type is then formed over the first major surface, thereby burying the first pattern of zones.

A second pattern of isolating zones of first conductivity type is formed through the epitaxial layer to intersect, and thus contact electrically, the original substrate.

Next, a third pattern of deep contact zones of second conductivity type is formed through the epitaxial layer to intersect at least a portion of the perimeter of each of the first buried zones. The deep contact zones are disposed to intersect and partially overlap the isolating zones. Functionally, these deep contact zones may provide a low series resistance contact to the collector of a transistor. They may also define the lateral extent of a resistor.

Next, impurities of the first conductivity type are introduced nonselectively into the entire surface of the epitaxial layer to form therein localized zones of the first conductivity type delimited in lateral extent by said deep contact zones. Functionally, these localized zones of first conductivity type will provide the base zones for transistors and the resistive portion of resistors.

Finally, a fourth pattern of zones of second conductivity type is formed in and adjacent the surface of the epitaxial layer. Some zones of this fourth pattern are formed within base zones to provide emitter zones therein. Other zones of this fourth pattern may be formed within the deep contact zones to compensate for the impurities introduced therein during the previous nonselective process. Still other zones of the fourth pattern may be formed within or adjacent resistor zones to provide further geometric definition thereof.

In one aspect, an important feature of this invention is the use of deep contact zones to define the lateral extent of base zones and resistor zones, and further that this use obviates the need for a selective base forming step with its attendant photolithographic masking step.

Another important feature of this invention is that deep contact zones intersect and partially overlap isolating zones to significantly reduce the area required per isolated functional element.

Also important to the goal of reduced device area is the use of thin epitaxial layers, thereby incurring less lateral spreading of solid state diffusion steps, particularly the isolation diffusion and the deep contact diffusion, which penetrate completely through the epitaxial layer.

BRIEF DESCRIPTION OF THE DRAWING

This invention will be more clearly understood from the following detailed description taken in conjunction with the drawing in which.

DETAILED DESCRIPTION

Figure 1:
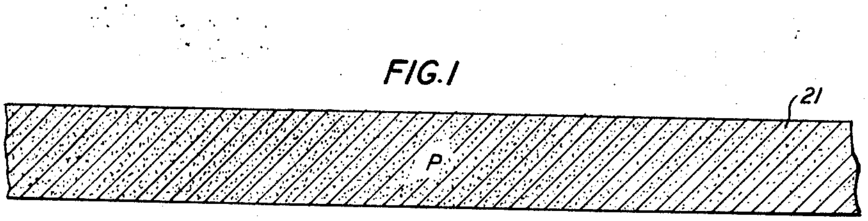
FIGS. 1–7 are cross-sectional schematic views of a portion of a semiconductor wafer substantially as it appears following successive fabrication steps in accordance with a first described embodiment of this invention in which back-to-back diodes provide junction isolation.

In one embodiment, as shown in FIG. 1 the fabrication begins with a monocrystalline silicon wafer 21 which may be a portion of a slice of P-type conductivity produced by boron doping to have a substantially uniform resistivity of about 5 ohm-centimeters. This portion 21 typically may have a thickness of from a few microns to several hundred microns and may be suitably prepared for subsequent processing by mechanical lapping and polishing or by chemical milling, all well known in the art.

Figure 2:
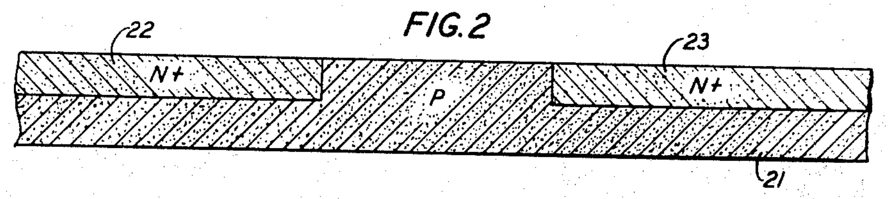

The next step in the fabrication of the junction-isolated integrated circuit device structure, as illustrated in FIG. 2, is the formation of zones 22 and 23 of relatively low resistivity N-type conductivity within the P-type substrate wafer.

Zones 22 and 23 are typically formed by solid-state diffusion and are confined substantially to the rectilinear-shaped areas as shown in FIG. 2 by well-known photolithographic and oxide masking techniques. A slow-diffusing impurity such as antimony or arsenic, or a relatively faster diffusing impurity such as phosphorous may be diffused to form these zones. The selection of the impurity to be employed depends on considerations of out-diffusion from the substrate during subsequent heat treatments.

For a specific example, N-type zones 22 and 23 may be diffused, using antimony as an impurity, to a surface concentration of about $10^{20}$ atoms per cubic centimeter or greater and to a depth of about one to two microns.

Figure 3:
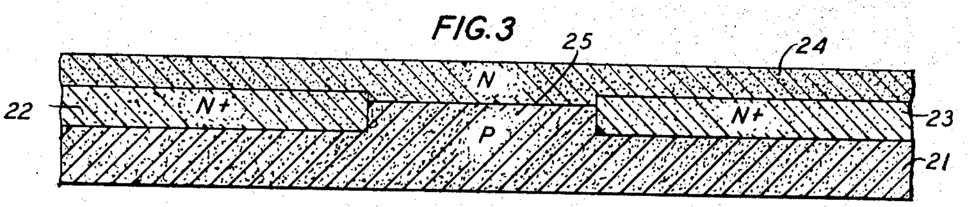

As indicated in FIG. 3, an N-type layer 24 is formed on the face of the P-type substrate, typically by epitaxial deposition processes well known in the art. For the purposes of this invention, epitaxial layer 24 will be typically less than about 2 microns thick, and in a specific example, is about 1.2 microns thick and is doped with antimony to provide a substantially uniform resistivity of about 0.1 ohm-centimeter. It will be noted that, by definition, a 0.1 ohm-centimeter layer which is one micron thick has a sheet resistivity of 1,000 ohms per square.

Since the epitaxial growth process usually involves a substantial heat treatment, some outdiffusion of zones 22 and 23 into epitaxial layer 24 will occur. This accounts for the apparent non-uniformity in the thickness of epitaxial layer 24 indicated in FIG. 3.

Figure 4:
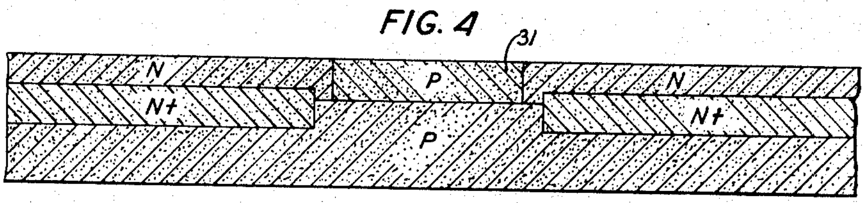

As shown in FIG. 4, P-type isolation zones such as zone 31 are selectively formed, typically by solid-state diffusion, completely through epitaxial layer 24 to intersect and thus contact electrically the P-type substrate zones which surround buried layer zones 22 and 23. The isolation zones may be localized by photolithographic and oxide masking techniques and may be formed by solid-state diffusion using boron as the acceptor impurity with a surface concentration of about $3 \times 10^{19}$ atoms per cubic centimeter after diffusion.

Figure 5:
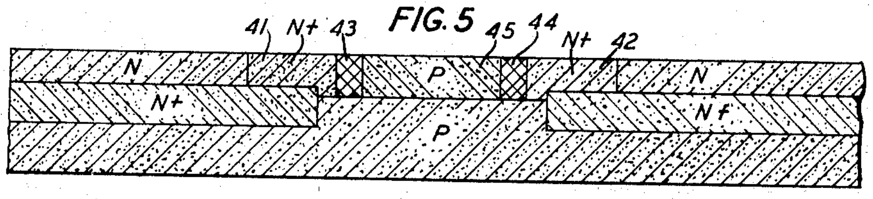

Next, deep contact zones 41 and 42, shown in cross section in FIG. 5, are formed typically by solid state diffusion, selectively through the epitaxial layer to intersect peripheral portions of buried layer zones 22 and 23. As in previous selective diffusion steps, zones 41 and 42 may be localized using standard photolithographic and oxide masking techniques. Typically, phosphorous having a surface concentration of greater than $10^{20}$ atoms per cubic centimeter is used. It will be appreciated that zones 41 and 42 may be used to define the lateral extent of the base area of a transistor or to define the lateral geometry of resistor zones.

It will be noted in FIG. 5 that deep contact zones 41 and 42 are shown partially overlapping isolation zone 45 in regions 43 and 44. This is shown to emphasize that, for low voltage applications, these zones may indeed intersect and partially overlap with no resulting deleterious effects, except, of course, for a slight increase in parasitic isolation capacitance. This means that precise registration of diffusion masks for deep contact patterns and isolation patterns with preceding patterns is not essential. With respect to produce yield, this relaxed tolerance is a further advantage of this invention.

Since the concentration of N-type impurities in deep contact zones 41 and 42 is higher than the concentration of P-type impurities in the isolation zone 45, the overlapping zones 43 and 44 will be of relatively high resistivity N-type conductivity.

Figure 6:
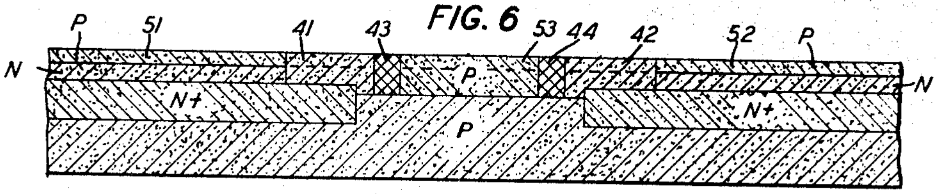

The next step as shown in FIG. 6 is to introduce, typically by diffusion, P-type impurities nonselectively into the surface of the epitaxial layer. The concentration of acceptor impurities resulting from the nonselective P-type diffusion is advantageously adjusted to be low enough so that the N-type deep contact zones 41 and 42 are not converted to intrinsic or P-type, but high enough to form, in all other portions of layer 24, P-type zones 51, 52, and 53 in which the concentration of ionized impurity atoms decreases with distance inward from the surface.

Zones 51 and 52 may provide the body of a resistor or the base of a transistor. These zones should be diffused to a depth greater than the depth to which transistor emitters will subsequently be diffused. In this specific embodiment, zones 51, 52, and 53 were diffused to an initial depth of about 0.5 micron, with a surface concentration greater than $3 \times 10^{19}$ impurities per cubic centimeter, thus giving an effective sheet resistivity in these zones of about 300 ohms per square.

Of course, the processing sequence can be altered by performing the nonselective P-type step prior to forming the N-type deep contact zones 41 and 42. In this event, the doping impurities and concentrations would be selected to enable the N-type zones to "punch through" the non-selective P-type layer in selected positions.

Figure 7:
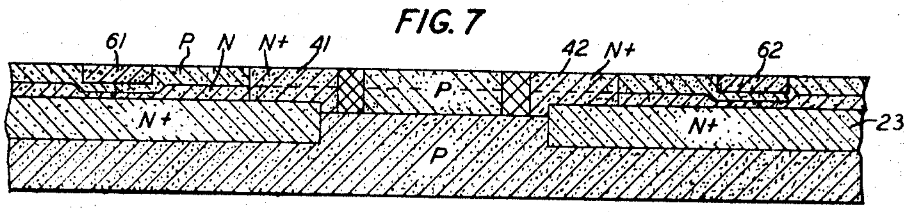

A final step, typically localized solid-state diffusion, forms relatively low resistivity N-type emitter zones 61 and 62, shown in FIG. 7. This relatively shallow N-type diffusion may be done at the same temperature used for the N-type deep contact zones described hereinabove, but is of shorter duration.

In a specific embodiment emitter zones were diffused to a depth of about 0.4 micron with a surface concentration greater than $10^{20}$ phosphorous atoms per cubic centimeter. Inasmuch as this N-type emitter diffusion is a selective photolithographic process, one can, with but slight increase in complexity, again diffuse N-type impurities into the deep contact zones to offset the effects of the nonselective P-type diffusion into these zones. Exercising this option will be advantageous where minimum collector series resistance is a goal, as in low power dissipation, nonsaturating logic circuits.

Some redistribution of previously diffused impurities will usually be experienced during each of the above described diffusion steps. In particular, that portion of the base-collector junction underneath the base-emitter junction may be expected to move to a final depth of about 0.6–0.7 micron from the surface of the epitaxial layer. If such redistribution is to be avoided, known ion implantation techniques may be used to achieve the desired introduction of the desired impurities.

It will be noted that FIGS. 1 to 7 schematically show a portion of two isolated transistors.

It will be apparent that a variety of arrangements may be adopted for accomplishing actual electrical contact to the semiconductor zones and for accomplishing the interconnection of integrated arrays of functional elements to form an integrated circuit device. A particularly advantageous technique includes the use of a beam lead technology such as disclosed in M. P. Lepselter U.S. Pat. No. 3.335,338.

In a second embodiment of this invention, depicted in FIGS. 8, 9, 10, and 11, electrical isolation between functional elements is provided by means of the pinch-off characteristic of junction field-effect devices.

Initial fabrication according to this second embodiment proceeds as in the first embodiment described hereinabove up to and including the step of forming the thin epitaxial layer, i.e., as depicted in and described with reference to FIGS. 1, 2, and 3. That is, an N-type epitaxial layer about one micron thick is formed over a P-type substrate into which N-type buried layers have been formed.

Figure 8:
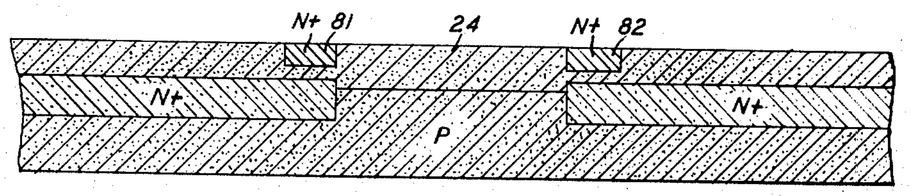
FIGS. 8-11 are cross-sectional views of just the later steps of fabrication in accordance with a second described embodiment of this invention in which junction field-effect transistors provide junction isolation.

Then, as shown in FIG. 8, N-type deep contact zones 81 and 82 are formed at least partially through epitaxial layer 24 typically by selective diffusion techniques. For a 1 micron thick epitaxial layer, zones 81 and 82 may typically be diffused to an initial depth of about 0.6 micron. Some further diffusion will inevitably occur due to subsequent heat treatments.

Figure 9:
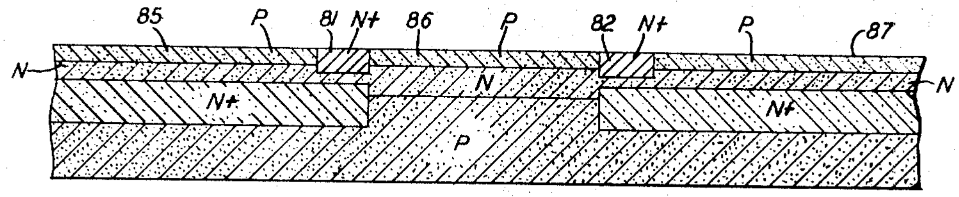

As shown in FIG. 9, a nonselective P-type base diffusion is then performed into the entire surface of epitaxial layer 24 to form P-type zones 85, 86, and 87 therein. As in the first embodiment, the concentration of this nonselective P-type diffusion should be advantageously adjusted to avoid converting zones 81 and 82 to P-type or intrinsic and may typically be diffused to a depth of about 0.5 micron.

Figure 10:
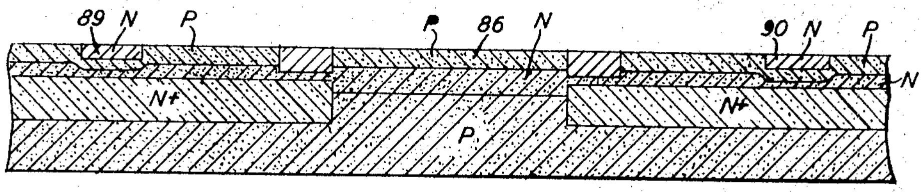

As shown in FIG. 10, a final selective N-type diffusion is performed, as in the first embodiment, to form emitter zones 89 and 90, etc.

Figure 11:
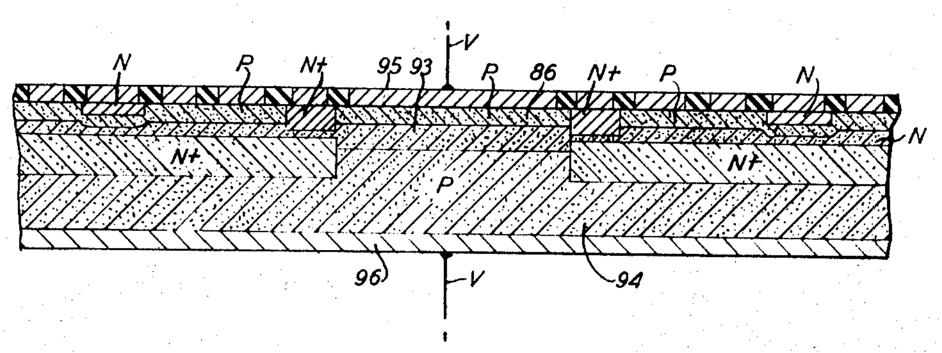

FIG. 11 shows the resulting structure with an oxide on the surface and metal contacts to the silicon as appropriate. A particularly advantageous technique for accomplishing electrical contact to the silicon and for accomplishing interconnection of function elements includes the use of a beam lead technology such as disclosed in M. P. Lepselter U.S. Pat. No. 3,335,338.

It will be noted in FIG. 11, that P-type zone 86, N-type zone 93, and P-type substrate 94 may be considered a junction field-effect transistor. Consequently, if a sufficient negative potential relative to zone 93 is applied to both P-type zones 86 and 94 through metal contacts 95 and 96 respectively, space-charge depletion regions from both reverse biased PN-junctions will extend completely through zone 93 causing this zone to be "pinched-off." That is, zone 93, when pinched-off presents a high impedance to the lateral flow of current therethrough, and electrical isolation between the two adjacent functional elements is accomplished.

That this form of isolation is allowed by the thin epitaxial layer will be apparent from the following analysis. For a one micron thick N-type epitaxial layer of about 0.5 ohm-centimeter resistivity, the ionized impurity concentration is about $1.2 \times 10^{16}$ therein. With a P-type diffusion having surface concentration of about $3 \times 10^{19}$ and diffused to a depth of about 0.5 micron into the epitaxial layer, the resulting PN-junction will have a total depletion layer thickness of about 0.5 micron, extending primarily into the higher resistivity N-type zone 93 at about 3 volts reverse bias. That is, the junction field-effect transistor will be pinched-off, thus providing effective electrical isolation, well before any of the adjacent PN-junctions undergo avalanche breakdown.

Although the invention has been described in terms of certain specific embodiments, it will be understood that other arrangements may be devised by those skilled in the art which likewise fall within the scope and spirit of the invention.

For example, methods of forming diodes, capacitors, and field-effect devices have not been discussed because methods for forming these and other functional elements will be apparent from the foregoing description to those skilled in the art. The substitution of P-type for N-type and N-type for P-type in the embodiments described hereinabove to allow formation of PNP-bipolar transistors and complementary structures will also be apparent.

Furthermore, it will be appreciated by those in the art that ion implantation may be substituted for any solid state diffusion step recited hereinabove for the selective introduction and for the non-selective introduction of doping impurities into a semiconductor.

Still further, it will be appreciated that the buried layer zones are not essential to the practice of this invention. Based on considerations well known in the art, e.g., collector series resistance and parasitic transistor action, they may be included or omitted as desired.

We claim:

1. Method of fabricating a monolithic semiconductor integrated circuit device comprising the steps of:

forming a relatively thin epitaxial layer of a first conductivity type semiconductive material on a surface of a relatively thick monocrystalline semiconductor body, the bulk of which is of a second conductivity type, said body including a pattern of buried zones of first conductivity type adjacent said surface the layer being relatively lightly doped with respect to the buried zones;

selectively forming a pattern of isolating zones of second conductivity type completely through the epitaxial layer, said isolating zones disposed so as not to intersect a buried zone;

selectively diffusing a pattern of deep contact zones of first conductivity type into the epitaxial layer, each of said deep contact zones disposed opposite at least a portion of one of said buried zones and so as to partially overlap an isolating zone;

diffusing impurities of second conductivity type into the entire surface of the epitaxial layer to form therein base zones of second conductivity type, the lateral extent of said base zones being defined by said deep contact zones; and selectively diffusing emitter zones of first conductivity type into at least one of said base zones.

2. A method of fabricating a monolithic semiconductor integrated circuit including a plurality of functional elements isolated one from another comprising the steps of:

forming a relatively thin epitaxial layer of a first conductivity type semiconductive material on a surface of a relatively thick monocrystalline semiconductor body, the bulk of which is of a second conductivity type, said body including a pattern of buried zones of first conductivity type adjacent said surface, the layer being relatively lightly doped with respect to the buried zones;

selectively forming a pattern of isolating zones of second conductivity type completely through the epitaxial layer, said isolating zones disposed so as not to intersect a buried zone;

selectively forming a pattern of deep contact zones of first conductivity type at least partially through the epitaxial layer, the deep contact zones being disposed to overlie a portion of the perimeter of one of the buried zones;

introducing nonselectively into the entire surface of the epitaxial layer to a depth less than the depth to which the deep contact zones extend impurities of second conductivity type, the concentration of said nonselectively introduced impurities being insufficient to invert the conductivity type of the deep contact zones so that there is formed in the epitaxial layer localized zones of second conductivity type, the lateral extent of said localized zones being delimited by said deep contact zones; and selectively forming a shallow zone of first conductivity type into at least one of said localized zones of second conductivity type.

3. A method as recited in claim 2 additionally comprising the step of selectively introducing impurities of the first type semiconductivity into a deep contact zone simultaneously with the step of forming the shallow zone so as to compensate for the impurities of second conductivity type introduced into the deep contact zones during the nonselective impurity-introducing step.

4. A method as recited in claim 2 wherein the deep contact zones extend through the epitaxial layer to a depth sufficient to intersect said portion of the perimeter of one of the buried zones.

5. A method as recited in claim 2 wherein at least one of the zones is formed by solid state diffusion.

6. A method as recited in claim 2 wherein at least one of the zones is formed by ion implantation.

7. A method of fabricating a monolithic semiconductor integrated circuit including a plurality of functional elements isolated one from another comprising the steps of:

forming a relatively thin epitaxial layer of a first conductivity type semiconductive material on a surface of a relatively thick monocrystalline semiconductor body, the bulk of which is of a second conductivity type, said body including a pattern of buried zones of first conductivity type adjacent said surface the layer being relatively lightly doped with respect to the buried zones;

selectively forming a pattern of isolating zones of second conductivity type completely through the epitaxial layer;

selectively forming a pattern of deep contact zones of first conductivity type through the epitaxial layer, each of said deep contact zones disposed so as to partially overlap an isolating zone and so as to intersect portion of the perimeter of one of the buried zones;

introducing nonselectively into the entire surface of the epitaxial layer to a depth less than the depth to which the deep contact zones extend impurities of second conductivity type, the concentration of said nonselectively introduced impurities being insufficient to invert the conductivity type of the deep contact zones so that there is formed in the epitaxial layer localized zones of second conductivity type, the lateral extent of said localized zones being delimited by said deep contact zones; and selectively forming a shallow zone of first conductivity type into at least one of said localized zones of second conductivity type.

* * * * *